United States Patent [19]
Kaji et al.

[11] Patent Number: 5,571,578
[45] Date of Patent: Nov. 5, 1996

[54] METHOD FOR FORMING SILICON OXIDE ON A SEMICONDUCTOR

[75] Inventors: Naruhiko Kaji, Yokohama; Riichirou Aoki, Tokyo; Hiroyuki Toyama, Kitakami; Hidemitsu Egawa, Tokyo; Takamitsu Yoshida; Yukio Nishiyama, both of Yokohama, all of Japan

[73] Assignee: Kabushiki Kaisha Tohsiba, Kawasaki, Japan

[21] Appl. No.: 372,325

[22] Filed: Jan. 13, 1995

[30] Foreign Application Priority Data

Jan. 18, 1994 [JP] Japan ................................ 6-003549

[51] Int. Cl.⁶ ............................................ H05H 1/24
[52] U.S. Cl. ..................... 427/579; 427/255; 427/255.3; 427/294; 437/238; 437/243
[58] Field of Search ........................... 427/579, 585, 427/255.3, 294; 437/238, 243

*Primary Examiner*—Bernard Pianalto
*Attorney, Agent, or Firm*—Finnegan, Henderson, Farabow, Garrett & Dunner, L.L.P.

[57] ABSTRACT

A plasma CVD device having a chamber, an upper electrode provided in the chamber, an under electrode provided in the chamber to be opposite to the upper electrode and to mount a sample thereon, and a plurality of power sources having a different frequency connected to the upper electrode. Gas is introduced into the chamber of the plasma CVD device, the gas contains at least an organic silicon compound, $CF_4$ and $O_2$, and has an element ratio (F/Si) of silicon (Si), constituting the organic silicon compound, to fluorine (F), constituting $CF_4$, to be set to 15 or more. $Si(OC_2H_5)_4$ or $Si(OCH_3)_4$ is used as an organic silicon compound.

12 Claims, 5 Drawing Sheets

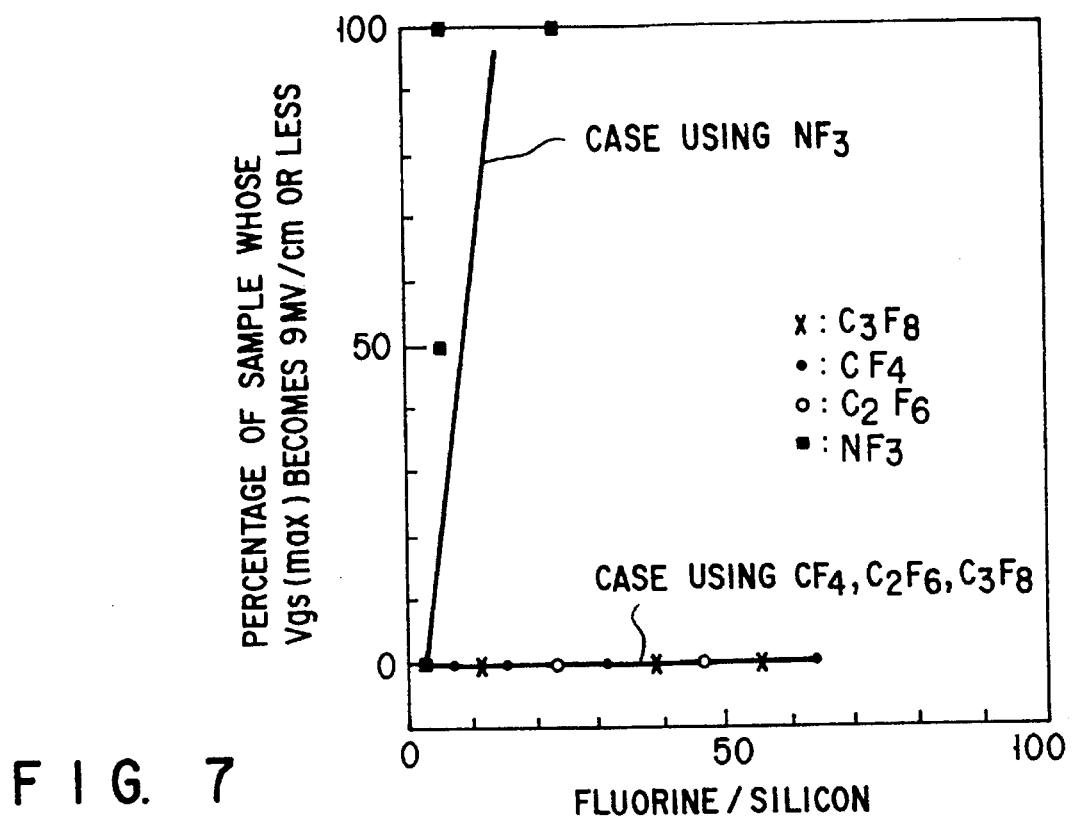
F I G. 7
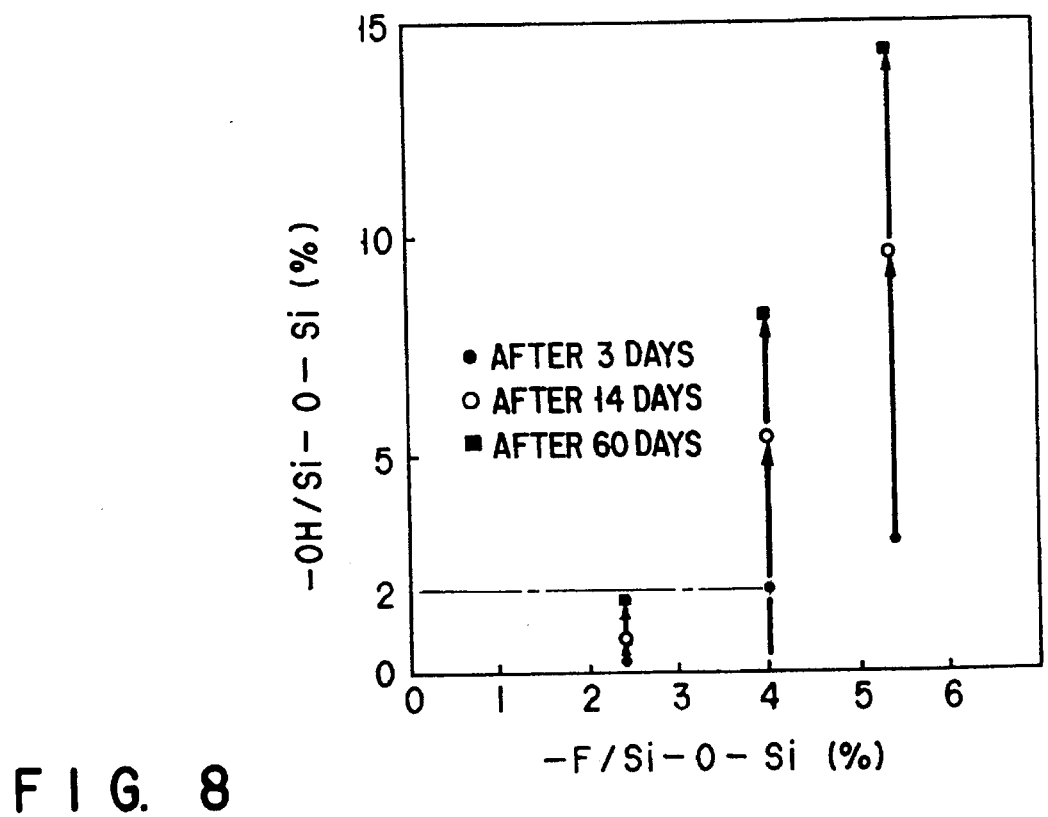
F I G. 8

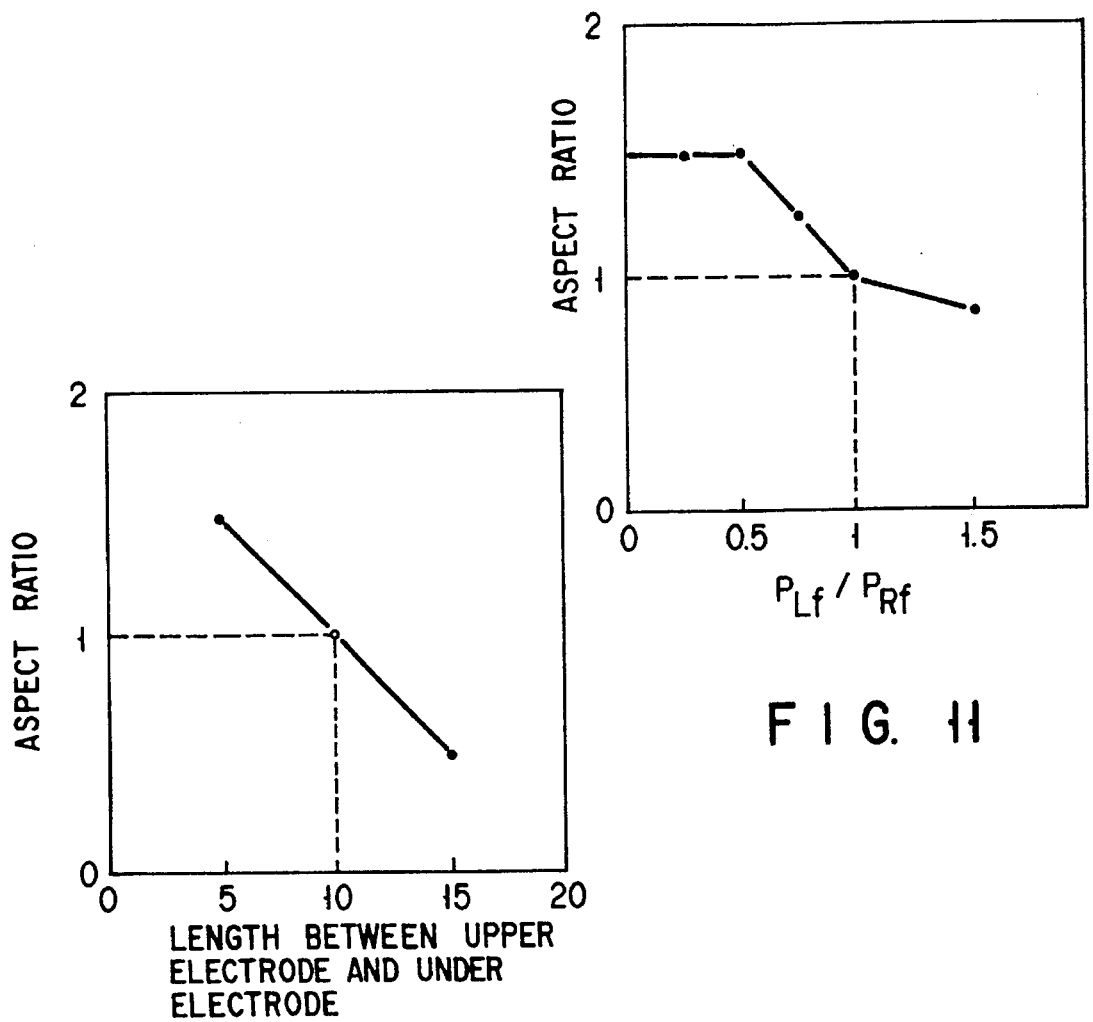
FIG. 11
FIG. 12
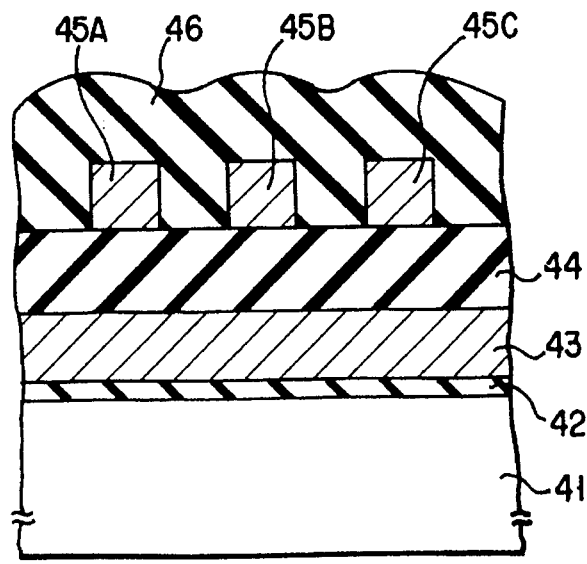
FIG. 13

METHOD FOR FORMING SILICON OXIDE ON A SEMICONDUCTOR

BACKGROUND OF THE INVENTION

1. Field of the Invention

The present invention relates to a method for forming silicon oxide, which is used in, for example, an interlayer insulator of a semiconductor device.

2. Description of the Related Art

The use of a multi-level interconnection is increased if degree of integration of the element constituting an LSI is increased.

The reason is as follows:

If the size of the element is reduced and the number of elements to be formed in one LSI is increased, the interconnection becomes complex and large-scaled. On the other hand, the size of the wire constituting the interconnection and the pitch cannot be made small.

The interlayer insulator is needed in a case where the semiconductor device using the multi-level interconnection is formed.

Conventionally, the interlayer insulator is formed by plasma CVD.

In a case where the interlayer insulator is formed of silicon oxide, a main gas includes TEOS (tetraethyl orthosilicate, which is expressed by Si $(OC_2H_5)_4$) and oxygen $(O_2)$ in plasma CVD.

Moreover, in plasma CVD, for improving a step coverage of silicon oxide to the wire, gas for etching silicon oxide, that is, gas of $NF_3$ is added to the main gas.

However, even if gas of $NF_3$ is added to the main gas, a space between a wire 11A and a wire 11B cannot be completely filled with a silicon oxide 12 when a ratio of a width W between the wires 11A and 11B to a height H of the wire, i.e., aspect ratio (H/W) is 1 or more. Due to this, a void 13 is generated between the wires 11A and 11B.

The generation of the void 13 makes reliability of the semiconductor device worse.

In order to solve this problem, there has been proposed a method in which the space between the wires 11A and 11b is filled with silicon oxide 12 without generating the void 13.

The above-mentioned method is plasma CVD in which two high frequencies, i.e., high frequency of 13.58 MHz and high frequency of several hundreds kHz are used to generate plasma.

According to the above method, the space between the wires can be completely filled with silicon oxide even if the aspect ratio (H/W) is 1 or more.

Moreover, according to the above method, the larger an element ratio of silicon (Si) to fluorine (F) (F/Si) becomes, the better the step coverage of silicon oxide to the wire becomes.

However, there is a problem in the point that, for example, as the larger the element ratio of silicon (Si) to fluorine (F) (F/Si) becomes, the more a characteristic of a gate insulating film of an MOS transistor is deteriorated.

Moreover, as the larger the element ratio of silicon (Si) to fluorine (F) (F/Si) becomes, the higher concentration of fluorine (F) of silicon oxide to be formed by plasma CVD becomes. If the concentration of fluorine (F) of silicon oxide to be formed by plasma CVD becomes higher, silicon oxide easily absorbs moisture. In other word, there is a problem in the point that moisture absorption of silicon oxide is increased and a characteristic of silicon oxide is deteriorated.

SUMMARY OF THE INVENTION

In consideration of the above problems, the present invention has been made, and an object of the present invention is to provide a method in which a space between wires can be completely filled with silicon oxide without generating a void, silicon oxide can not easily absorb moisture, and a characteristic of a gate insulating film of an MOS transistor is not deteriorated.

In order to attain the above object, according a first aspect of the present invention, there is provides a method for forming silicon oxide comprising the steps of preparing a plasma CVD device having a chamber, an upper electrode provided in the chamber, an under electrode provided in the chamber to be opposite to the upper electrode and to mount a sample thereon, and a plurality of power sources having a different frequency connected to the upper electrode; introducing gas into the chamber of the plasma CVD device, the gas containing at least an organic silicon compound, $CF_4$ and $O_2$, and having an element ratio (F/Si) of silicon (Si), constituting the organic silicon compound, to fluorine (F), constituting $CF_4$, to be set to 15 or more; and generating plasma in the chamber of the plasma CVD device to form silicon oxide containing F (fluorine) on the sample.

Also, according to a second aspect of the present invention, there is provided a method for forming silicon oxide comprising the steps of preparing a plasma CVD device having a chamber, an upper electrode provided in the chamber, an under electrode provided in the chamber to be opposite to the upper electrode and to mount a sample thereon, and a plurality of power sources having a different frequency connected to the upper electrode; introducing gas into the chamber of the plasma CVD device, the gas containing at least an organic silicon compound, $C_2F_6$ and $O_2$, and having an element ratio (F/Si) of silicon (Si), constituting the organic silicon compound, to fluorine (F), constituting $C_2F_6$, to be set to 15 or more; and generating plasma in the chamber of the plasma CVD device to form silicon oxide containing F (fluorine) on the sample.

Also, according to a second aspect of the present invention, there is provided a method for forming silicon oxide comprising the steps of preparing a plasma CVD device having a chamber, an upper electrode provided in the chamber, an under electrode provided in the chamber to be opposite to the upper electrode and to mount a sample thereon, and a plurality of power sources having a different frequency connected to the upper electrode; introducing gas into the chamber of the plasma CVD device, the gas containing at least an organic silicon compound, $C_3F_8$ and $O_2$, and having an element ratio (F/Si) of silicon (Si), constituting the organic silicon compound, to fluorine (F), constituting $C_3F_8$, to be set to 15 or more; and generating plasma in the chamber of the plasma CVD device to form silicon oxide containing F (fluorine) on the sample.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a view showing a relationship between the element ratio of silicon (Si) to fluorine (F) (F/Si) and the characteristic of the gate insulating film;

FIG. 8 is a view showing a relationship between an amount of fluorine (F) of silicon oxide and a moisture absorption of silicon oxide;

FIG. 11 is a view showing a relationship between a ratio of two power sources and the aspect ratio;

FIG. 12 is a view showing a relationship between a length L, which is between an upper electrode and an under electrode, and the aspect ratio; and FIG. 13 is a view showing a semiconductor device formed by the method of the present invention.

DETAILED DESCRIPTION OF THE PREFERRED EMBODIMENTS

Embodiments of the present invention will be explained with reference to the drawings.

Figure 1:
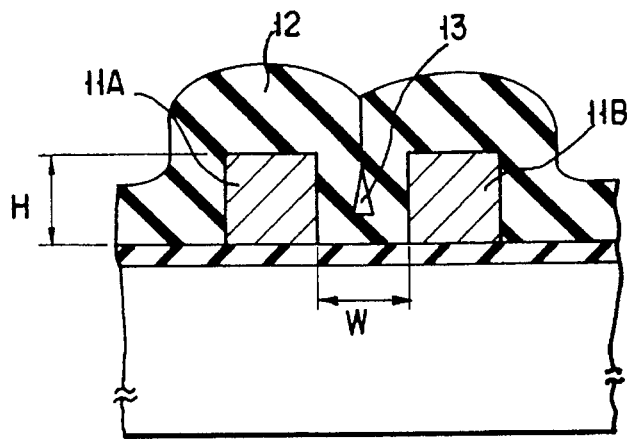
FIG. 1 is a view showing silicon oxide formed by a conventional method.
Figure 2:
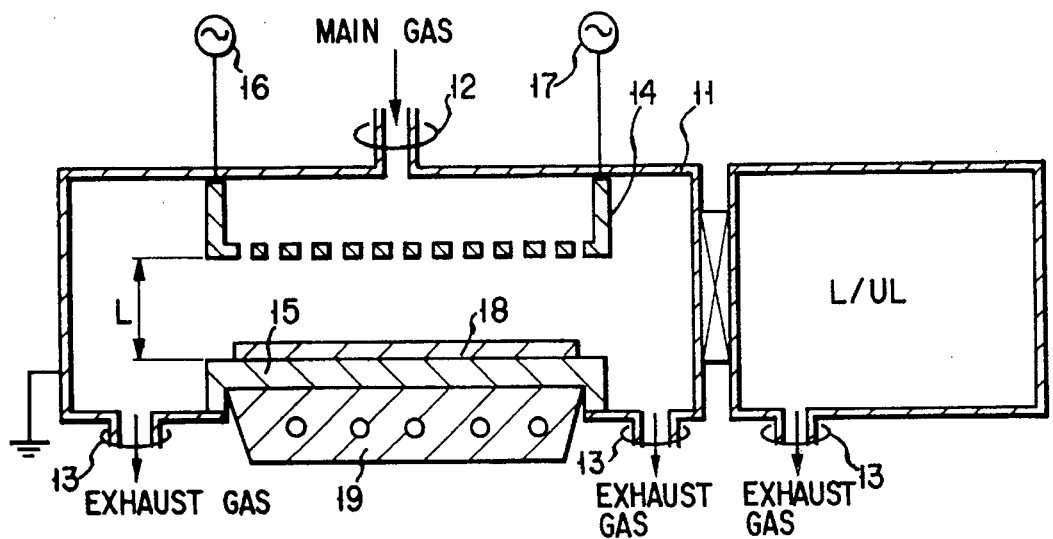
FIG. 2 is a view showing a plasma CVD device, which is used to carry out the method of the present invention.

FIG. 2 shows a plasma CVD device, which is used to carry out the method of the present invention.

A chamber 11 comprises an inlet 12 for introducing main gas and an outlet 13 for exhausting main gas. An upper electrode 14 and an under electrode 15 are provided in the chamber 11. The upper electrode 14 has a large number of holes.

Electric power sources 16 and 17 are connected to the upper electrode 14. The electric power source 16 applies high frequency of 13.56 MHz to the upper electrode 14, and the electric power source 17 applies high frequency of 400 KHz to the upper electrode 14.

A wafer 18 is mounted on the under electrode 15. Silicon oxide is formed on the wafer 18. A heater 19 is provided to be adjacent to the under electrode 15. The heater 19 has a function of keeping the temperature of the wafer 18 constant at the time of forming silicon oxide.

The following will explain a method for forming silicon oxide of the present invention.

In this embodiment, the method for forming silicon oxide by use of the plasma CVD device of FIG. 2 is explained.

First of all, a sample (wafer), which is in the middle of the manufacturing process of the semiconductor device, is prepared. This sample comprises a semiconductor substrate 21 and an insulating film 22 formed on the semiconductor substrate 21, and wires 23A and 23B formed on the insulating film 22.

The wires 23A and 23B comprise metal such as polysilicon whose impurity material is doped and aluminum, and a high melting metal such tungsten.

The height of each of the wires 23A and 23B is shown by H, and the width between the wires 23A and 23B is shown by W. An aspect ratio of this sample is expressed by H/W. In this embodiment, a condition in which the space between the wires 23A and 23B can be completely filled with silicon oxide is provided to the sample whose aspect ratio is 1 or more.

Figures 3, 4:
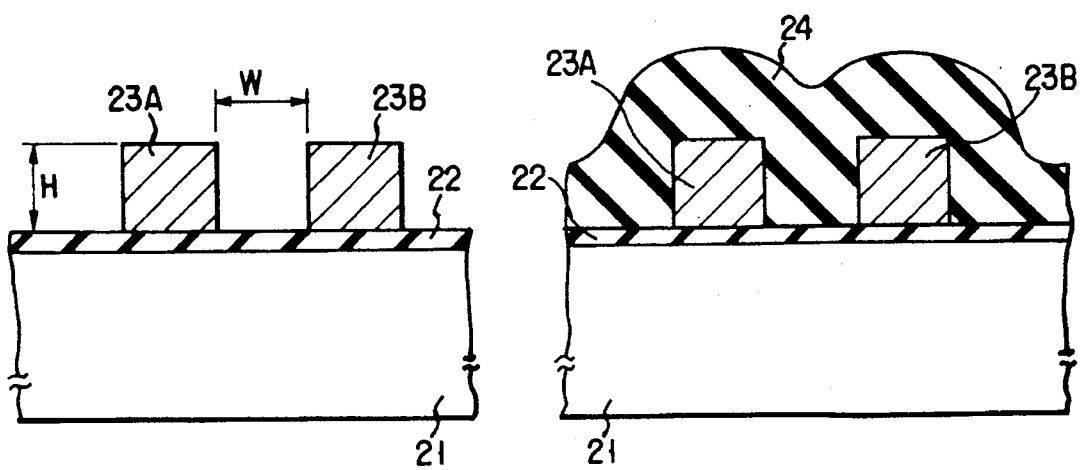
FIG. 3 is a view showing a sample in which the method of the present invention is carried out.
FIG. 4 is a view showing silicon oxide formed by the method of the present invention.

Next, the sample of FIG. 3 is provided on the under electrode 15 of the plasma CVD device of FIG. 2.

Then, silicon oxide is formed on the sample of FIG. 3 under the following conditions:

(1) Pressure of the chamber 11 is about 5 Torr.

(2) $(P_{Rf}/P_{Lf})<1$, wherein $P_{Rf}$ is electric power of the electric power source 16, and $P_{Lf}$ is electric power of the electric power source 17.

(3) A ratio of main gas is TEOS: $O_2$: He:a compound of fluorine and carbon such as $CF_4$, $C_2F_6$, $C_3F_8$= 1:10:10:X.

(4) The temperature of the sample is about 400° C.

(5) The size of the sample (wafer size) is 6 inches.

One of the features of the present invention lies in the point that the compound of fluorine and carbon such as $CF_4$, $C_2F_6$, $C_3F_8$ is sued as the main material (etching gas of silicon oxide).

If silicon oxide is formed on the sample under the above-mentioned conditions, the space between the wires 23A and 23B can be completely filled with silicon oxide 24 as shown in FIG. 4.

Figure 5:
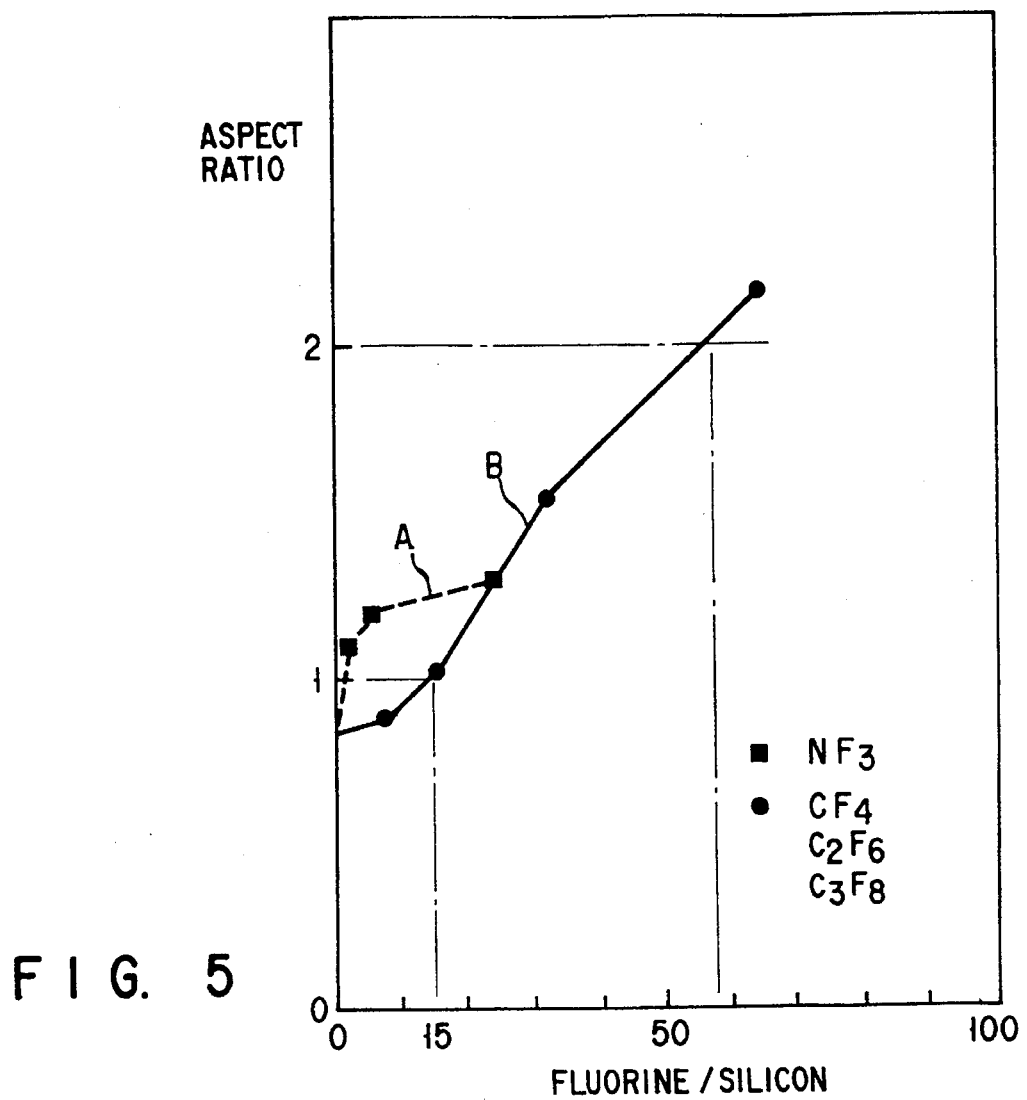
FIG. 5 is a view showing a relationship between an element ratio of silicon (Si) to fluorine (F) (F/Si) and an aspect ratio.

FIG. 5 shows a relationship between an element ratio of silicon (Si) to fluorine (F) (F/Si) and the aspect ratio of the sample in the above-mentioned method for forming silicon oxide.

In FIG. 5, each of parts under each of portions shown by curves A, B, C shows an area where the space between the wires can be completely filled. For example, when the main gas is $CF_4$, and the element ratio of silicon (Si) to fluorine (F) (F/Si) is 15, the space between the wires can be completely filled with silicon oxide in the entire sample whose aspect ratio is about 1 or less.

The element ratio (F/Si) can be changed by kinds of main gas, and the flow rate.

For example, in a case where the main gas such as TEOS $(Si(OC_2H_5)_4, Si(OCH_3)_4)$ is used and $CF_4$ is used as etching gas of silicon oxide, the element ratio (F/Si) becomes 4 if the flow rate of TEOS and that $CF_4$ are equal to each other.

Moreover, if the flow rate of TEOS is 10 sccm and that of $CF_4$ is (10×Q) sccm, the element ratio (F/Si) becomes (4×Q).

Furthermore, in a case where the main gas such as TEOS $(Si(OC_2H_5)_4, Si(OCH_3)_4)$ is used and $C_2F_6$ is used as etching gas of silicon oxide, the element ratio (F/Si) becomes 6 if the flow rate of TEOS and that $C_2F_6$ are equal to each other.

Also, if the flow rate of TEOS is 10 sccm and that of $C_2F_6$ is (10×Q) sccm, the element ratio (F/Si) becomes (6×Q).

Furthermore, in a case where the main gas such as TEOS $(Si(OC_2H_5)_4, Si(OCH_3)_4)$ is used and $C_3F_8$ is used as etching gas of silicon oxide, the element ratio (F/Si) becomes 8 if the flow rate of TEOS and that $C_3F_8$ are equal to each other.

Also, if the flow rate of TEOS is $_{10}$ sccm and that of $C_3F_8$ is (10×Q) sccm, the element ratio (F/Si) becomes (8×Q).

The curve A shows a case in which $NF_3$ is used as etching gas of silicon oxide. This case shows the conventional case. The space between the wires can be completely filled under a predetermined condition in the sample having a predetermined aspect ratio. However, in this case, the characteristic of the insulating film (for example, gate insulating film of the MOS transistor) right under the wire is deteriorated.

The curve B shows a case indicating that one of $CF_4$, $C_2F_6$ and $C_3F_8$ is used as etching gas of silicon oxide.

In these cases, the more the element ratio (F/Si) is increased, the more the space between the wires can be completely filled in the sample having a high aspect ratio.

For example, in a sample in which $CF_4$ is used as etching gas of silicon oxide, the element ratio (F/Si) is 15 or more, and the aspect ratio is 1 or less, the space between the wires can be completely filled. Also, in a sample indicating that one of $C_2F_6$ and $C_3F_8$ is used as etching gas of silicon oxide, the element ratio (F/Si) is 58 or more, and the aspect ratio is 2 or less, the space between the wires can be completely filled.

Moreover, in the case where $CF_4$, $C_2F_6$ or $C_3F_8$ is used as etching gas of silicon oxide, the characteristic of the insulating film (for example, gate insulating film of the MOS transistor) right under the wire is not deteriorated.

FIG. 7 shows a comparison between influence exerted on the gate insulating film of the MOS transistor in using the method for forming silicon oxide of the present invention and influence exerted on the gate insulating film of the MOS transistor using the conventional method for forming silicon oxide.

Figure 6:
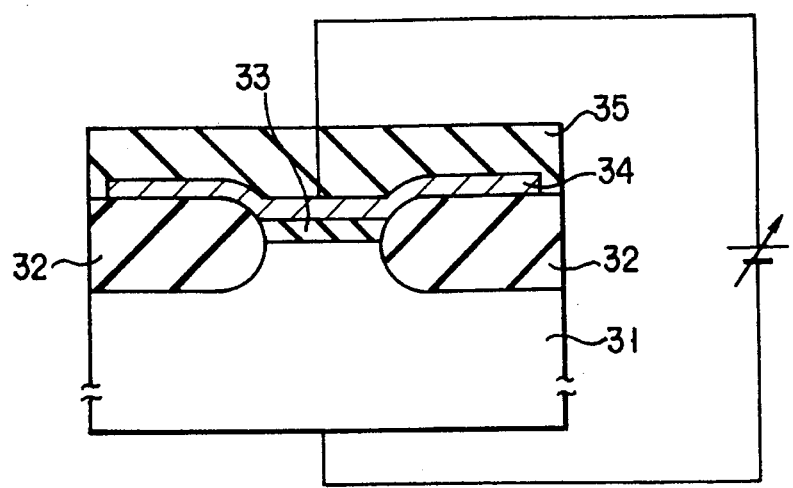
FIG. 6 is a view showing a method for evaluating a characteristic of a gate insulating film of a MOS transistor.

FIG. 6 shows the structure of the sample to obtain the measuring result of FIG. 7.

The above-mentioned sample comprises a semiconductor substrate 31, a field insulating film 32 formed on a field region on the semiconductor substrate, a gate insulating film 33 formed on an element region on the semiconductor device, a gate electrode 34 formed on the gate insulating film, and silicon oxide 35 formed on the entire surface of the semiconductor substrate 31.

In the sample of the present invention, silicon oxide 35 is formed by plasma CVD using $CF_4$, $C_2F_6$, or $C_3F_8$ as etching gas. Moreover, according to the present invention, there are prepared a plurality of samples in which the element ratio of silicon (Si) to fluorine (F) is changed.

In each of the samples, a voltage Vgs is applied between the substrate 31 and the gate electrode 34. The voltage Vgs can be varied. In each of the samples, a voltage, which is obtained when the gate insulating film 33 generates breakdown, is set to Vgs (max).

FIG. 7 shows the percentage of the sample whose voltage Vgs (max) becomes 9 MV/cm or less among the entire samples.

According to FIG. 7, when the element ratio (F/Si) of the conventional sample becomes about 10, the percentage of the sample whose voltage Vgs (max) becomes 9 MV/cm or less is 50%. Moreover, when the element ratio (F/Si) of the conventional sample becomes about 15, the percentage of the sample whose voltage Vgs (max) becomes 9 MV/cm or less is substantially about 100%.

In contrast, according to the present invention, the percentage of the sample whose voltage Vgs (max) becomes 9 MV/cm or less is always 0%. The sample of the present invention does not relate to the element ratio (F/Si).

As mentioned above, in the case where the element ratio (F/Si) is about 15%, the space between the wires of the sample whose aspect ratio is 1 or less can be completely filled, and the percentage of the sample whose voltage Vgs (max) becomes 9 MV/cm or less is 0%. In the conventional sample, the percentage of the sample whose voltage Vgs (max) becomes 9 MV/cm or less is substantially about 100%.

FIG. 8 shows the relationship between the amount of fluorine (F) of silicon oxide and a moisture absorption of silicon oxide.

Silicon oxide formed by the method of the present invention includes fluorine (F).

If the amount of fluorine (F) of silicon oxide is 4% or more, silicon oxide abruptly absorbs moisture.

Therefore, according to this embodiment, it is best that the semiconductor device whose amount of fluorine (F) of silicon oxide formed by the method of the present invention be used.

Figure 9:
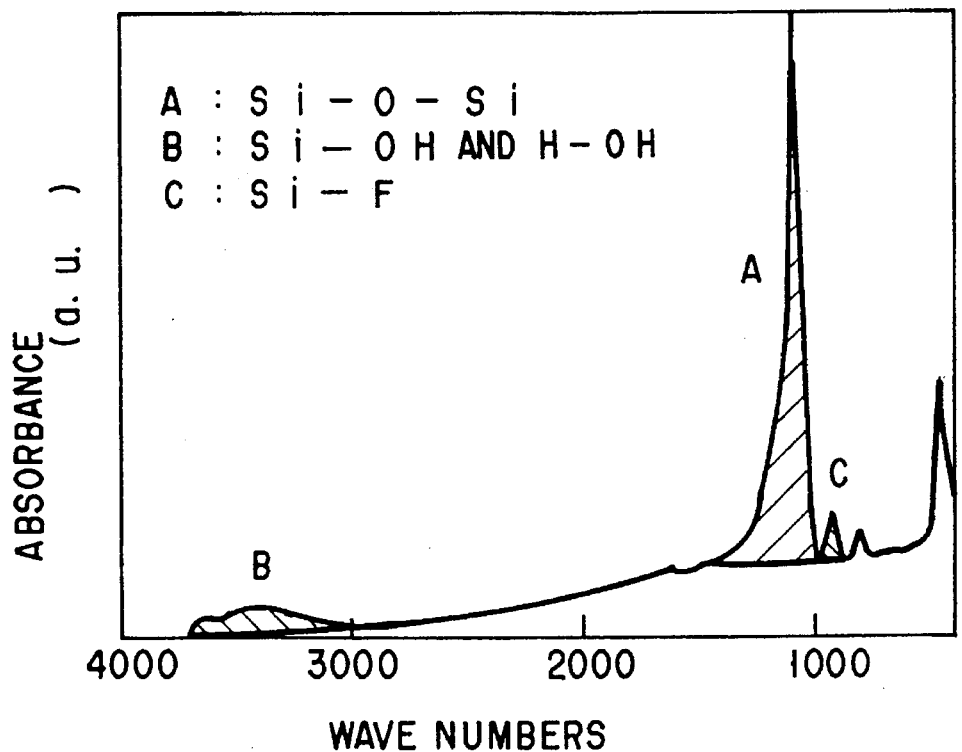
FIG. 9 is a view showing an infrared absorption spectrum obtained by FTIR (Fourier Transform Infrared Spectroscopy)

Regarding the semiconductor device having silicon oxide formed by the method of the present invention, the amount of fluorine (F) can be examined as follows:

FIG. 9 shows the infrared absorption spectrum obtained by FTIR (Fourier Transform Infrared Spectroscopy).

An area of a region A shows an amount of Si—O—Si, an area of a region B shows the total of an amount of Si—OH and that of H—OH, and an area of a region C shows an amount of Si—F.

Therefore, an amount of Fluorine (F) of silicon oxide can be expressed by the area of the region C/the area of the region A.

Regarding the amount (%) obtained by the above expression, 2.5% corresponds to about 5 atomic %.

Figure 10:
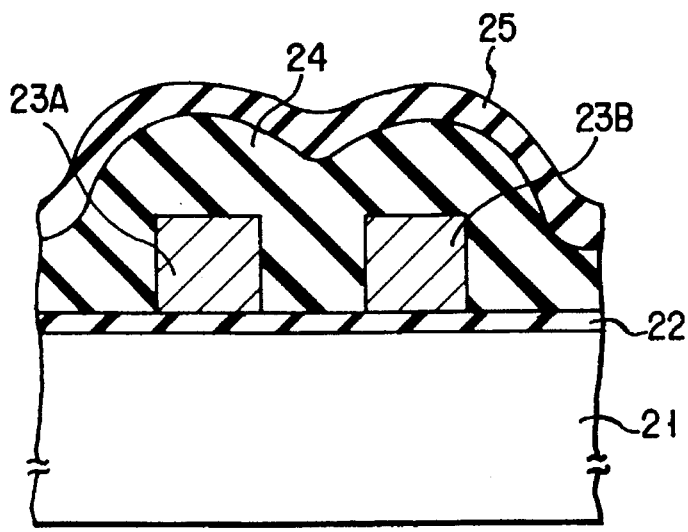
FIG. 10 is a view showing a semiconductor device formed by the method of the present invention.

The following will explain the measures of the case in which the amount of fluorine (F) of silicon oxide formed by the method of the present invention is 4% or more:

FIG. 10 shows the structure of the semiconductor device of the present invention.

The insulating film 22 is formed on the semiconductor substrate 21. The wires 23A and 23B are formed on the insulating film 22. Silicon oxide 24 containing fluorine (F) of 4% or more.

The space between the wires 23A and 23B is completely filled with silicon oxide 24. The insulating film 25 is formed on silicon oxide 24. The insulating is formed of silicon oxide containing fluorine (F) of below 4% or siliconnitride.

According to the above structure, absorption of moisture due to silicon oxide 24 can be prevented by the insulating film 25.

Moreover, if the insulating film 25 is formed by the plasma CVD of FIG. 2 right after silicon oxide 24 is formed, the through-put of the semiconductor device cannot be reduced.

FIG. 11 shows the relationship between the ratio of two power sources 16 and 17 of the plasma CVD of FIG. 2, and the aspect ratio. 10 Power of the electrode source having a high frequency is set to $P_{Rf}$ and power of the electrode source having a low frequency is set to $P_{Lf}$. If $P_{Rf}/P_{Lf}$ is 1 or less, that is, power $P_{Rf}$ of the electrode power having a high frequency is set to be smaller than power $P_{Lf}$ of the electrode power having a low frequency, the space between the wires of the sample whose aspect ratio is 1 or less can be completely filled with silicon oxide.

In FIG. 11, $CF_4$ is used as etching gas of silicon oxide, and the element ratio (F/Si) is set to about 30. Even in a case that $C_2F_6$ or $C_3F_8$ is used in place of $CF_4$ is used, or a case that the element ratio (F/Si) is changed, the same result can be obtained.

Therefore, in a case where the plasma CVD using two power sources having a different frequency is executed, it is best that power $P_{Rf}$ of the electrode power having a high frequency be set to be smaller than power $P_{Lf}$ of the electrode power having a low frequency, and that silicon oxide be formed on the sample.

FIG. 12 shows the relationship between a length L, which is between the upper electrode 14 and the under electrode 15, and the aspect ratio.

If the length L between the upper electrode 14 and the under electrode 15 is set to 10 mm or less, the space between the wires of the sample whose aspect ratio is 1 or less can be completely filled with silicon oxide by the plasma CVD.

In FIG. 12, $CF_4$ is used as etching gas of silicon oxide, and the element ratio (F/Si) is set to about 30. Even in a case that $C_2F_6$ or $C_3F_8$ is used in place of $CF_4$ is used, or a case that the element ratio (F/Si) is changed, the same result can be obtained.

Therefore, in a case where the method of the present invention is executed by the plasma CVD of FIG. 2, it is best that the length L between the upper electrode 14 and the under electrode 15 is set to 10 mm or less.

The above-mentioned method of the present invention can be applied to interlayer insulators 44 and 46 as shown in FIG. 13.

In FIG. 13, reference numeral 41 is a semiconductor substrate, 42: an insulating film, 43: a wire, 44 and 46: interlayer insulators, and 45A to 45C: wires.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for forming silicon oxide on a semiconductor sample comprising the steps of:

preparing a plasma CVD device having a chamber, an upper electrode provided in said chamber, an under electrode provided in said chamber to be opposite to said upper electrode, and first and second power sources connected to said upper electrode;

mounting said semiconductor sample onto said under electrode;

applying power of a first frequency to said upper electrode from said first power source;

applying power of a second frequency to said upper electrode from said second power source;

introducing gas into the chamber of said plasma CVD device, said gas containing at least an organic silicon compound, $CF_4$ and $O_2$, and having an element ratio (F/Si) of silicon (Si), constituting said organic silicon compound, to fluorine (F), constituting $CF_4$, to be set to 15 or more; and generating plasma in the chamber of said plasma CVD device to form silicon oxide containing F (fluorine) on said semiconductor sample.

2. A method for forming silicon oxide on a semiconductor sample comprising the steps of:

preparing a plasma CVD device having a chamber, an upper electrode provided in said chamber, an under electrode provided in said chamber to be opposite to said upper electrode, and first and second power sources connected to said upper electrode;

mounting said semiconductor sample onto said under electrode;

applying power of a first frequency to said upper electrode from said first power source;

applying power of a second frequency to said upper electrode from said second power source;

introducing gas into the chamber of said plasma CVD device, said gas containing at least an organic silicon compound, $C_2F_6$ and $O_2$, and having an element ratio (F/Si) of silicon (Si), constituting said organic silicon compound, to fluorine (F), constituting $C_2F_6$, to be set to 15 or more; and generating plasma in the chamber of said plasma CVD device to form silicon oxide containing F (fluorine) on said semiconductor sample.

3. A method for forming silicon oxide on a semiconductor sample comprising the steps of:

preparing a plasma CVD device having a chamber, an upper electrode provided in said chamber, an under electrode provided in said chamber to be opposite to said upper electrode, and first and second power sources connected to said upper electrode;

mounting said semiconductor sample onto said under electrode;

applying power of a first frequency to said upper electrode from said first power source;

applying power of a second frequency to said upper electrode from said second power source;

introducing gas into the chamber of said plasma CVD device, said gas containing at least an organic silicon compound, $C_3F_8$ and $O_2$, and having an element ratio (F/Si) of silicon (Si), constituting said organic silicon compound, to fluorine (F), constituting $C_3F_8$, to be set to 15 or more; and generating plasma in the chamber of said plasma CVD device to form silicon oxide containing F (fluorine) on said semiconductor sample.

4. A method according to claim 1, 2 or 3, wherein said organic compound is one selected from $Si(OC_2H_5)_4$ and $Si(OCH_3)_4$.

5. A method according to claim 1, 2 or 3, wherein said silicon oxide is formed such that concentration of fluorine (F) of said silicon oxide is below 4%.

6. A method according to claim 1, 2 or 3, wherein said silicon oxide is formed such that concentration of fluorine (F) of said silicon oxide is 4% or more, thereafter silicon oxide containing fluorine (F) whose concentration is below 4% or siliconnitride is formed on said silicon oxide.

7. A method according to claim 1, 2 or 3, wherein said silicon oxide is formed such that a length L between said upper electrode and said under electrode is 10 mm or less.

8. A method according to claim 1, 2 or 3, wherein said first frequency of said first power source is higher than said second frequency of said second power source, and said power of said first power source is lower than said power of said second power source.

9. A method according to claim 8, wherein the frequency of said first power source is 13.56 MHz, and the frequency of said second power source is 400 MHz.

10. A method according to claim 1, 2, or 3, wherein a temperature of said semiconductor sample is kept constant while said silicon is formed on said semiconductor sample.

11. A method according to claim 1, 2, or 3, wherein said semiconductor sample comprises a semiconductor substrate, an insulating film on said semiconductor substrate, and first and second wires on said insulating film.

12. A method according to claim 11, wherein when heights of said first and second wires are H, a width between said first and second wires is W, and an aspect ratio H/W of said semiconductor sample is 1 or more.

* * * * *